(12) United States Patent
Basaran

(10) Patent No.: US 8,498,598 B2
(45) Date of Patent: Jul. 30, 2013

(54) RF-DEMODULATOR, CALIBRATION CIRCUITRY AND METHODS FOR CALIBRATING AN RF-DEMODULATOR

(75) Inventor: Umut Basaran, Unterhaching (DE)

(73) Assignee: Intel Mobile Communications GmbH, Neubiberg (DE)

( * ) Notice: Subject to any disclaimer, the term of this patent is extended or adjusted under 35 U.S.C. 154(b) by 146 days.

(21) Appl. No.: 13/085,601

(22) Filed: Apr. 13, 2011

(65) Prior Publication Data

US 2012/0264391 A1 Oct. 18, 2012

(51) Int. Cl.
*H04B 17/00* (2006.01)
(52) U.S. Cl.
USPC ............... 455/226.1; 455/302; 455/232.1

(58) Field of Classification Search
USPC ............... 455/232.1, 255, 226.1, 302
See application file for complete search history.

(56) References Cited

U.S. PATENT DOCUMENTS

2008/0132191 A1* 6/2008 Quinlan et al. ............... 455/302

* cited by examiner

*Primary Examiner* — Christian Hannon
(74) *Attorney, Agent, or Firm* — Eschweiler & Associates, LLC

(57) ABSTRACT

An RF-demodulator includes an RF-input, a demodulator output, a mixing and amplification stage coupled between the RF-input and the demodulator output, and a calibration circuitry. The calibration circuitry is configured to apply a calibration input signal at the RF-input and sense a resulting calibration output signal at the demodulator output to derive a gain of the mixing and amplification stage based on the relationship between the calibration output signal and the calibration input signal.

21 Claims, 10 Drawing Sheets

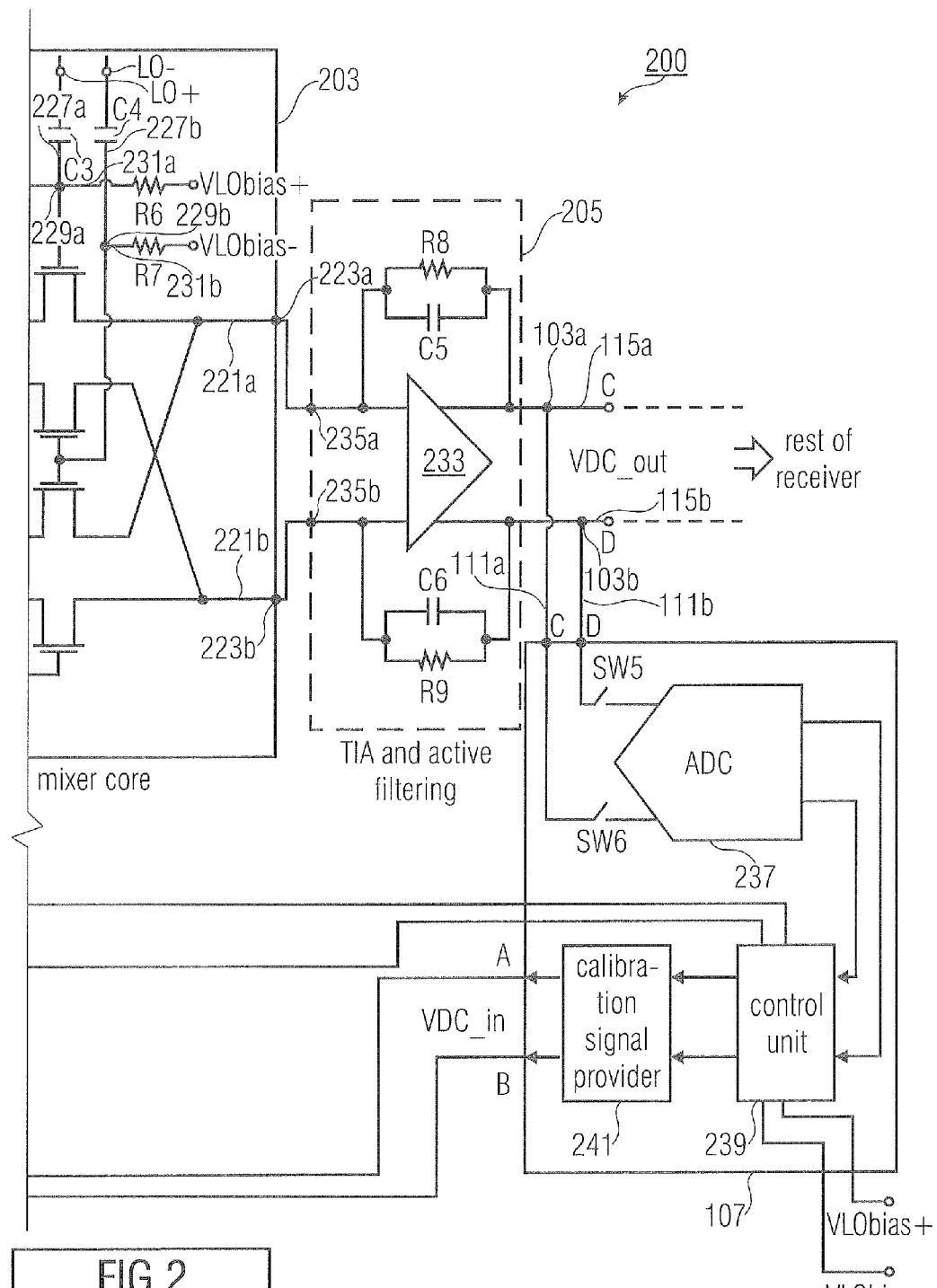

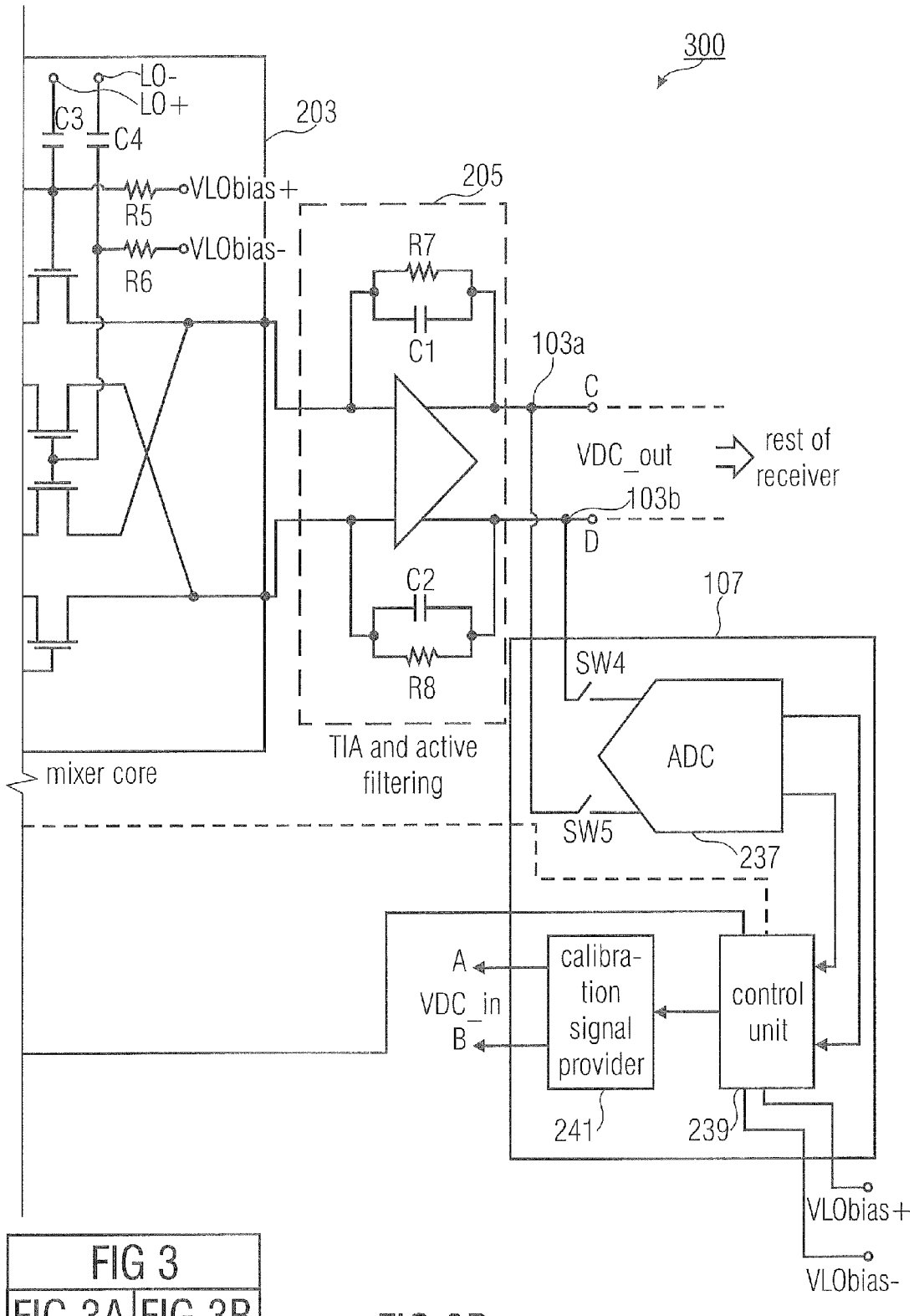

RF-DEMODULATOR, CALIBRATION CIRCUITRY AND METHODS FOR CALIBRATING AN RF-DEMODULATOR

FIELD

Embodiments relate to RF-demodulators which, as an example, may be used in RF receivers. Further embodiments relate to calibration circuits for calibrating such RF-demodulators. Further embodiments relate to methods for calibrating such RF-demodulators.

BACKGROUND

The gain of a demodulator is prone to process and temperature variations. This results in gain variations, due to a deviation of the transconductance of transistors and the resistance of resistors used in such demodulators, from their target value.

In conventional systems, the DC transconductance of the transistors have been measured by a separate test structure (separate from the demodulator). This has two main disadvantages: (1) a mismatch between the transistors in the test structure and the transistors in the demodulator circuit leads to an inaccuracy in the calibration, and (2) the gain deviation due to the resistors cannot be calibrated.

SUMMARY

Embodiments create an RF-demodulator comprising an RF-input, an RF-output and a mixing and amplification stage coupled between the RF-input and the RF-output. Furthermore, the RF-demodulator comprises a calibration circuitry configured to apply a calibration input signal at the RF-input, and sense a resulting calibration output signal at the RF-output to derive a gain of the mixing and amplification stage, based on the relationship between the calibration output signal and the calibration input signal.

Further embodiments create a calibration circuitry for an RF-demodulator, the RF-demodulator comprising an RF-input, an RF-output, and a mixing and amplification stage coupled between the RF-input and the RF-output. The calibration circuitry is configured to apply a calibration input signal at the RF-input, and sense a resulting calibration output signal at the RF-output, derive a gain of the mixing and amplification stage, based on the relationship between the calibration output signal and the calibration input signal. Furthermore, the calibration circuitry is configured to switch between different configurations of the mixing and amplification stage, based on the derived gain of the mixing and amplification stage.

BRIEF DESCRIPTION OF THE DRAWINGS

Embodiments will be described in detail using the accompanying figures, in which.

Before embodiments of the present invention are described in detail using the accompanying figures, it is to be pointed out that equal or functionally equal elements are provided with the same reference numbers, and that a repeated description of elements provided with the same reference numbers is omitted. Hence, descriptions of elements provided with the same reference numbers are mutually exchangeable.

DETAILED DESCRIPTION

Figure 1:
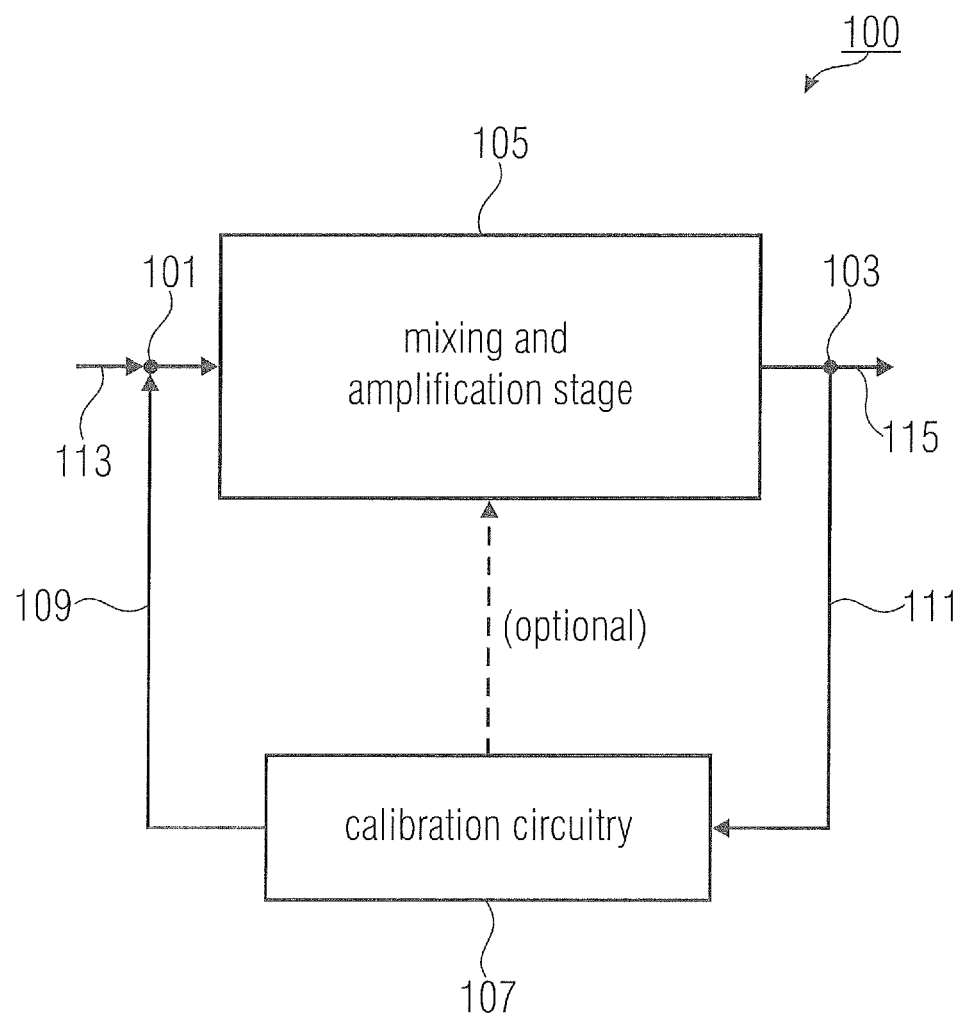
FIG. 1 shows a block schematic diagram of an RF-demodulator according to an embodiment.

FIG. 1 shows a block schematic diagram of an RF-demodulator 100. The RF-demodulator 100 comprises an RF-input 101 and an RF-output 103.

In the following, an RF-demodulator may be designated also as demodulator.

Furthermore, the RF-demodulator 100 comprises a mixing and amplification stage 105 coupled between the RF-input 101 and the RF-output 103. Furthermore, the RF-demodulator 100 comprises a calibration circuitry 107 configured to apply a calibration input signal 109 at the RF-input 101, and sense a resulting calibration output signal 111 at the RF-output 103. The calibration circuitry 107 is further configured to derive a gain of the mixing and amplification stage 105 based on a relationship between the calibration output signal 111 and the calibration input signal 109.

It is an idea that the gain of the mixing and amplification stage 105 can be determined with a high accuracy, when the calibration input signal 109 is applied to the RE-input 101 of the mixing and amplification stage 105, and when the resulting calibration output signal 111 (which is amplified by the mixing and amplification stage 105) is sensed or measured at the RF-output 103 of the mixing and amplification stage 105. By applying the calibration input signal 109 directly to the RF-input 101 of the mixing and amplification stage 105, instead of using a special test structure, the gain of the demodulator 100 (e.g. the gain applied by the mixing and amplification stage 105) can be measured directly, without any additional test circuits. Therefore, no mismatch between transistors in a test structure and the transistors in the demodulator 101 can occur. Furthermore, a gain deviation of resistors in the mixing and amplification stage 105 of the demodulator 100 is also taken into account. The derived gain of the mixing and amplification stage 105, therefore, has a high accuracy. This enables a precise calibration of the mixing and amplification stage 105 with a high accuracy. As an example, the complete gain of the demodulator 100 (and therefore of the mixing and amplification stage 105) can be calibrated for different process corners (e.g. slow, fast, etc.) and different temperatures.

As an example, the deviation of the total demodulator gain 100 (which is equal to the gain of the mixing and amplification stage 105) can be measured and these gain errors originating from temperature and process variations can be calibrated. As an example, the calibration circuitry 107 may be configured to switch between different configurations of the mixing and amplification stage 105 based on the determined gain of the mixing and amplification stage 105. Different configurations of the mixing and amplification stage 105 may correspond to different gains of the mixing and amplification stage 105. The calibration circuitry 107 may choose the configuration for the mixing and amplification stage 105 which matches a desired gain for the mixing and amplification stage 105.

According to some embodiments, the mixing and amplification stage 105 may be configured to mix and amplify an RF-input signal 113 received at the RF-input 101, to provide an RF-output signal 115 at the RF-output 103, for example, as a mixed and amplified version of the RF-input signal 113. For example, the RF-input signal 113 may be a receive signal received at a certain (high) receive frequency. The mixing and amplification stage 105 may amplify this receive signal and mix it down to a lower frequency (e.g. down to the baseband or an intermediate frequency), such that the RF-output signal 115 is a downmixed and amplified version of the received signal at the RF-input 101.

The mixing and amplification stage 105 may apply the same gain to the RF-input signal 113 as it does to the calibration input signal 109. In other words, the mixing and amplification signal stage 105 may be configured to route the calibration input signal 109 along the same signal paths like the RF-input signal 113. As an example, in one embodiment the calibration circuitry provides the calibration input signal 109, at the same node as the RF-input signal 113 is provided (e.g. at the RF-input 101), and the calibration output signal 111 is sensed at the same node of the mixing and amplification stage, at which the mixing and amplification stage 105 also provides the RF-output signal 115 (e.g. at the RF-output 103). By doing so, it can be achieved that the gain applied to the calibration input signal 109, to derive the calibration output signal 111, is equal to the gain which is applied to the RF-input signal 113 (by the mixing and amplification stage 105) to derive the RF-output signal 115. In other words, the mixing and amplification stage 105 may be configured to not distinguish between the RF-input signal 113 and the calibration input signal 109, such that it applies the same gain to the RF-input signal 113 and the calibration input signal 109.

The calibration circuitry 107 may be configured to provide the calibration input signal 109 as a DC signal, for example, having a constant amplitude. The RF-input signal 113 may be an AC signal, for example, a QAM (Quadrature Amplitude Modulated) signal.

According to some embodiments, calibration circuitry 107 may be configured to apply the calibration input signal 109 to the RF-input 101, when no RF signal is applied to the RF-input 101, for example, when no antenna circuit or antenna is connected to the RF-input 101. As an example, a preceding stage (e.g. an LNA-Low noise amplifier) may be in front of a mixer input stage of the mixing and amplification stage 105 (e.g. connected to the RF-input 101).The input of this preceding stage can be decoupled from the antenna or short circuited during the calibration. The LNA may be coupled between the antenna circuit and the RF-input 101. In other words, according to an embodiment, the calibration circuitry 107 may be configured to decouple an antenna circuit or an antenna (which may be external to the RF-demodulator 100) from the RE-input 101, prior to applying the calibration input signal 109. As an example, the calibration circuitry 107 may apply the calibration input signal 109 to the RE-input 101 during a starting or booting of the RF-demodulator 100, during which the RF-demodulator 100 does not receive RF-signals.

According to further embodiments, for example, in a GSM system (GSM=Global Standard for Mobile Communication), the calibration circuitry 107 may apply the calibration input signal 109 between two transmit bursts of an RF-input signal 113.

According to further embodiments, for example, in a UMTS system (UMTS=Universal Mobile Telecommunication Standard), the calibration circuitry 107 may be configured to apply the calibration input signal 109 during guard periods of an UMTS input signal 113.

According to further embodiments, calibration circuitry 107 and the mixing and amplification stage 105 can be implemented on a common substrate (e.g. on the same chip).

By determining the gain of the mixing and amplification stage 105, using the same signal paths through the mixing and amplification stage 105, along which, RF-signals are routed also, the gain of the mixing and amplification stage 105 can be determined with a high accuracy, and can be very precisely calibrated. Deviations of the gain due to process, temperature or age can be reduced or even compensated. Thus, derivations may occur because of variations of transconductances of the transistors of the mixing and amplification stage 105, or of resistance values of resistors of the mixing and amplification stage 105. These variations may occur due to several (stochastic) influences as, for example, age, process variation, and temperature.

The calibration circuitry 107 may be configured to repeatedly derive the gain of the mixing and amplitude stage 105, for example, triggered by a change of such influences, for example, a change of temperature.

Furthermore, due to the use of the calibration circuitry 107 for calibrating the gain of the mixing and amplification stage 105, no external testing equipment during production of the RF-demodulator 100, and therefore, no additional test time, is required for calibrating the gain of the mixing and amplification stage 105, as this can be done by the RF-demodulator 100 itself, using the calibration circuitry 107.

Figure 2A:
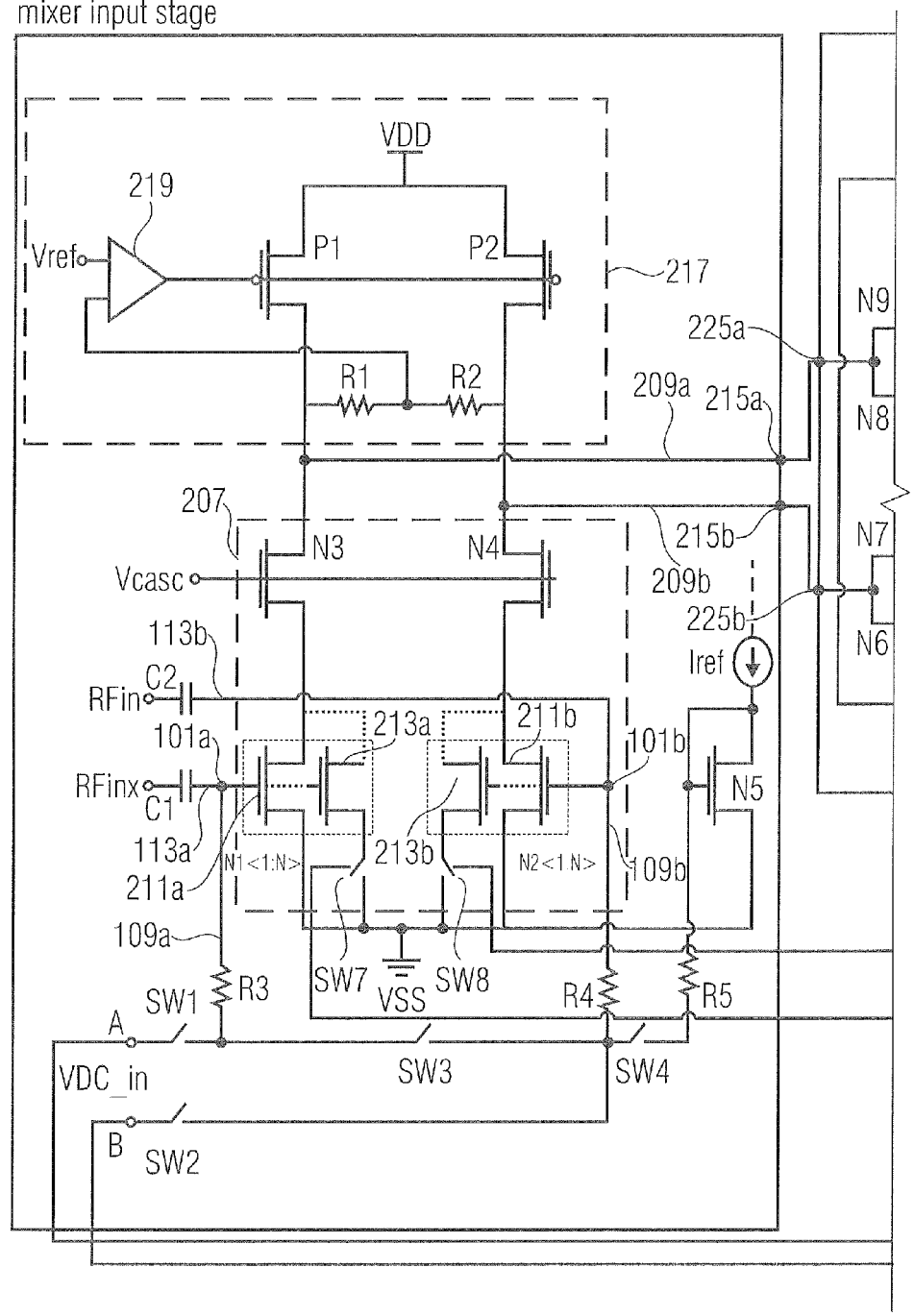
FIG. 2 shows an equivalent circuitry of an RF-demodulator according to a further embodiment with a plurality of switchable input transistors configured to adjust a gain of the mixing and amplification stage of the RF-demodulator.
Figure 3A:
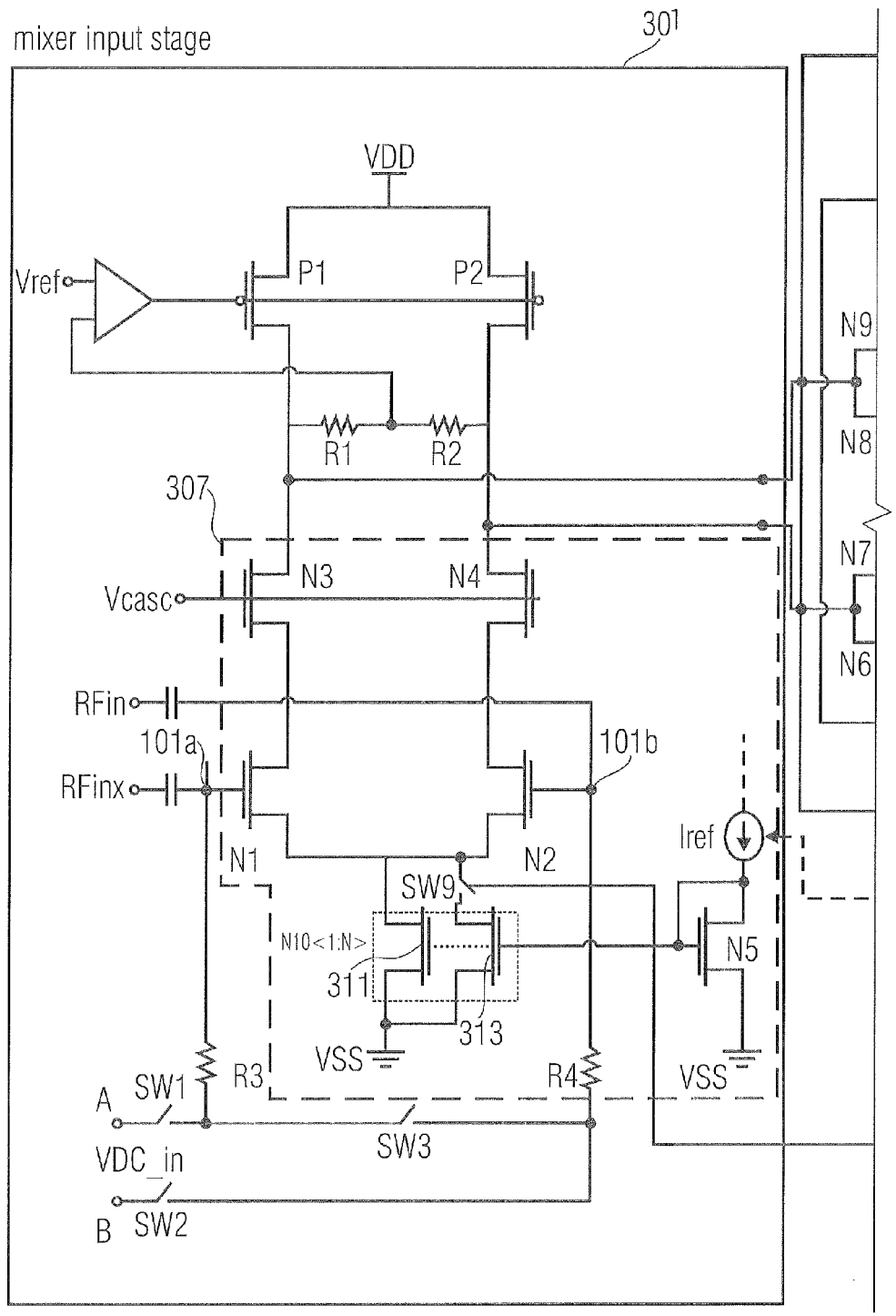
FIG. 3 shows an equivalent circuitry of an RF-demodulator according to a further embodiment with an adjustable current mirror, configured to adjust a gain of a mixing and amplification stage of the RF-demodulator.

In the following, different RF-demodulators according to embodiments will be described using FIGS. 2 and 3. In FIGS. 2 and 3, different possibilities of adjusting the gain of the mixing and amplification stage are shown.

Further embodiments may comprise combinations of these techniques of adjusting the gain of the mixing and amplification stage, based on the relationship between the calibration input signal and the calibration output signal.

FIG. 2 shows an equivalent circuit of an RF-demodulator 200. The RF-demodulator 200 is a possible implementation of the RF-demodulator 100. A mixing and amplification stage of the RF-demodulator 200 comprises a mixer input stage 201, a mixer core 203, and an active filtering stage 205 coupled between an RF-input 101a, 101b and an RF-output 103a, 103b of the RF-demodulator 100. Furthermore, FIG. 2 shows a possible implementation of a calibration circuitry 107. The calibration circuitry 107 is coupled to the RF-output 103a, 103b and the RF-input 101a, 101b, to provide a calibration input signal 109a, 109b (also designated as VDC_in) and to sense a calibration output signal 111a, 111b (also designated as VDC_out).

As can be seen from FIG. 2, the mixing and amplification stage of the RE-demodulator 200 is configured to receive an RF-input signal 113a, 113b as a differential signal and to provide an RE-output signal 115a, 115b as a differential signal. Therefore, the calibration circuitry 107 is also configured to provide the calibration input signal 109a, 109b as a differential signal and to sense the calibration output signal 111a, 111b as a differential signal.

Nevertheless, the concept shown in FIG. 2 and the concepts shown in the following figures are also applicable to a single ended implementation, in which a mixing and amplification stage receives an RF-input signal as a single ended signal and provides an RF-output signal as a singled ended signal. In this case, a calibration circuitry may provide the calibration signal as a single ended signal and may sense the calibration output signal as a single ended signal.

In the differential implementation in FIG. 2, an amplitude and a sign of the calibration input signal 109a, 109b (VDC_in) is defined by the difference between the two calibration input part signals 109a, 109b. The same applies for the calibration output signal 111a, 111b, i.e. a sign and an amplitude of the calibration output signal 111a, 111b (VDC_out) is defined by the difference between the two calibration out-put part signals 111a, 111b.

In one embodiment, the calibration circuitry 107 is configured to provide the calibration input signal 109a, 109b as a voltage at the RF-input 101a, 101b. The mixing and amplification stage is configured to provide the RF-output signal 115a, 115b, and therefore, the calibration output signal 111a, 111b as a voltage at the RF-output 115a, 115b. The calibration circuitry 107 is configured to sense this voltage at the RF-output 103a, 103b.

A gain of the mixing and amplification stage is dependent on a signal path for the RF-input signals 113a, 113b from the RF-input 101a, 101b to the RF-output 103a, 103b through the mixer input stage 201, the mixer core 203 and the active filtering stage 205. The calibration circuitry 107 may vary the gain of the mixing and amplification stage, by switching between different configurations of the mixing and amplification stage, each configuration corresponding to a different gain of the mixing and amplification stage.

The mixer input stage 201 is configured to amplify the calibration input signal 109a, 109b and to provide a first intermediate calibration signal 209a, 209b at an output 215a, 215b of the mixer output stage 201. As an example, the mixer input stage 201 may be configured to amplify the calibration input signal 109a, 109b and to transform the calibration input signal 109a, 109b from the voltage domain to a current domain. In other words, the mixer input stage 201 may be configured to provide the first intermediate calibration signal 209a, 209b as a current, for example, to be input into the mixer core 203.

The mixer input stage 201 may further be configured to amplify the RF-input signal 113a, 113b received at the RF-input 101a, 101b and provide a first intermediate RF signal at the output 215a, 215b of the mixer input stage 201. Furthermore, the mixer input stage 201 is configured to use one and the same signal path (e.g. one and the same amplification stage) for amplifying the calibration input signal 109a, 109b and the received RF-input signal 113a, 113b. Therefore, the gain of the mixer input stage 201, which is applied to a received RF-input signal, is the same as the gain applied to the calibration input signal 109a, 109b. By using the same signal path for the RF signal, 113a, 113b and the calibration input signal 109a, 109b, it can be ensured that the measured gain of the mixing and amplification stage applied to the calibration input signal 109a, 109b, is equal to the gain which the mixer input stage 201 applies to received RF-signals. In this manner, a precise calibration of the mixer input stage 201 (and of the mixing and amplification stage) can be achieved, for example, by comparing the derived gain with a desired gain fora certain configuration of the mixing and amplification stage. According to further embodiments, the mixer input stage 201 may comprise an input circuit 207 (as shown in FIG. 2), the input circuit 207 being coupled to the RF-input 101a, 101b. The calibration circuitry 107 may be configured to switch between different configurations of the input circuit 207, based on the derived gain of the mixing and amplification stage. Different configurations of the input circuit 207 may correspond to different gains applied to the calibration input signal 109a, 109b, and therefore, to the RF-input signal 113a, 113b.

By switching between the different configurations of the input circuit 207, the calibration circuitry 107 can adjust the gain of the mixing and amplification stage to a desired gain.

As mentioned before, the gain of the mixing and amplification stage may be dependent on transconductances of transistors used in the mixing and amplification stage. Therefore, the calibration circuitry 107 may be configured to switch between different transconductances of the input circuit 207, based on the derived gain of the mixing and amplification stage, for example, to adjust the gain. In the example shown in FIG. 2, the input circuit 207 comprises a plurality of input transistors N1, N2, control terminals of which are coupled to the RE-input 101a, 101b. The calibration circuitry 107 may be configured to switch between the different transconductances by selectively activating and deactivating input transistors of the plurality of input transistors N1, N2.

In this application a controlled path of a transistor may be a drain source path or an collector emitter path of the transistor. A control terminal of the transistor may be a gate terminal or a base terminal.

In the example shown in FIG. 2, the plurality of input transistors are divided into a first group of input transistors N1, and a second group of input transistors N2. Control terminals of the first group of input transistors N1 are coupled (e.g. directly connected) to a first node 101a of the RF-input 101a, 101b, at which the first calibration input part signal 109a is provided. Control terminals of the second group N2 of input transistors are connected to a second terminal 101b of the RF-input 101a, 101b, at which the second calibration input part signal 109b is provided. The calibration circuitry 107 may be configured to, independently from each other, activate input transistors from the first group N1 and the second group N2, based on the derived gain of the mixing and amplification stage, for example, using switches SW7, SW8.

By activating and deactivating the input transistors, the transconductances of the input circuit 207 for the first calibration input part signal 109a and the second calibration input part signal 109b can be altered independently from each other. In other words, the calibration circuitry 107 is configured to adjust a transconductance for the first calibration input part signal 109a of the differential calibration input signal 109a, 109b (and therefore for a first RF-input part signal 113a of the differential RF-input signal 113a, 113b) independent from the transconductance for the second calibration input part signal 109b of the calibration input signal 109a, 109b (and therefore of the second RF-input part signal 113b of the differential RF-input signal 113a, 113b).

In the example shown in FIG. 2, the first group N1 of input transistors comprises a first input transistor 211a, a controlled path of which is constantly coupled to the output of the mixer input stage 101 (in detail to a first output node 215a of the output 215a, 215b of the mixer input stage 201).

Furthermore, the first group N1 comprises a second input transistor 213a, a controlled path of which is switchably coupled between the reference potential terminal VSS and the output 215a, 215b of the mixer input stage 201 (in detail, the second output node 215b of the output 215a, 215b of the mixer input stage 201).

In the example shown in FIG. 2, the switch SW7 is coupled between the controlled path of the second input transistor 213a of the first group N1 and the reference potential terminal VSS. According to further embodiments, the switch SW7 or an additional switch may be placed between the controlled path of the second input transistor 213a and the first output node 215a of the mixer input stage 201.

Furthermore, the first group N1 may comprise additional input transistors, for example, an arbitrary number of input transistors, each input transistor being switchably coupled between the first output node 215a of the mixer input stage 201 and the reference potential terminal VSS.

Furthermore, the second group N2 comprises a first input transistor 211b, a controlled path of which is constantly coupled between the second output node 215b of the mixer input stage 201 and the reference potential terminal VSS.

Furthermore, the second group N2 comprises a second input transistor 213b being switchably coupled (using the switch SW8) between the second output node 215b of the mixer input stage 201 and the reference potential terminal VSS.

As with the first group of input transistors N1, the second group of input transistors N2 may comprise additional input transistors, which may be switchably coupled between the reference potential terminal VSS and the second output node 215b of the mixer input stage 201.

Furthermore, the switches for activating the input transistors may be placed between the controlled paths of the input transistors and the second output node 215b of the mixer input stage 201 and/or the reference potential terminal VSS.

According to further embodiments, in a single ended implementation, the second group of transistors N2 may be omitted.

To summarize, the calibration circuitry 107 may be configured to activate an input transistor of the plurality of input transistors N1, N2 by coupling its controlled path between the reference potential terminal VSS and the output 215a, 215b of the mixer input stage 201 and to deactivate the transistor by decoupling the transistor's controlled path from the reference potential terminal VSS and/or the output 215a, 215b of the mixer input stage 201.

By changing the transconductances of the input circuit 207, the gain of the input circuitry 207 can be altered and therefore calibrated. Furthermore, by changing the transconductance of the first group N1 of input transistors independently from the transconductance of the second group N2 of input transistors, a signal path for the first calibration input part signal 109a can be calibrated independent from a signal path for the second calibration input part signal 109b.

Furthermore, the mixer input stage 201 may comprise a cascode circuit N3, N4 coupled between the output 115a, 115b of the mixer input stage 201 and the plurality of input transistors N1, N2. As shown in the example in FIG. 2, the cascode circuit may comprise a first cascode transistor N3, a controlled path of which is coupled between the first output node 215a and the first group N1 of input transistors and a second cascode circuit N4, a controlled path of which is coupled between the second output node 215b and the second group N2 of input transistors. Control terminals of the cascode transistors N3, N4 may be coupled to a common cascode potential terminal, at which a constant cascode voltage Vcasc is applied. The cascode circuit N3, N4 is used for isolating the output 215a, 215b of the mixer input stage 201 from the plurality of input transistors N1, N2.

In other words, the mixer input stage 201 in FIG. 2 is a pseudo differential common source amplifier with the cascode transistors N3, N4.

According to further embodiments, the cascode circuit may be omitted.

According to further embodiments, the mixer input stage 201 may comprise a controlled current source 217 configured to provide an operating point for the input circuit 207. As shown in FIG. 2, the controllable current source 217 may be configured to provide an operating point for the first cascode transistor N3 and an operating point for the second cascode transistor N4.

Furthermore, the controllable current source may be coupled to the output 215a, 215b of the mixer input stage 201.

The controllable current source 217 comprises a first current source transistor P1, a controlled path of which is coupled between a supply voltage terminal VDD and the first output node 215a of the output 215a, 215b of the mixer input stage 201. Furthermore, the controlled current source 217 comprises a second current source transistor P2, a controlled path of which is coupled between the supply voltage terminal VDD and the second output node 215b of the output 215a, 215b of the mixer input stage 201. Furthermore, the controllable current source 217 may comprise an amplifier 219 (e.g. a difference amplifier). An output of the amplifier 219 may be coupled to control terminals of the current source transistors P1, P2. A first input of the amplifier 219 may be coupled to a reference voltage terminal at which a reference voltage Vref for the controllable current source 217 is provided. A second input of the amplifier 219 may be coupled to a common node of a first resistor R1 and a second resistor R2 of the controllable current source 217, a second node of the first resistor R1 may be coupled to the first output node 215a and a second node of the second resister R2 may be coupled to the second output node 215b.

The amplifier 219 is configured to adjust a voltage at the common node of the resistor R1 and the resistor R2, such that it equals the reference voltage Vref by adjusting voltages at the control terminals of the two current source transistors P1, P2.

The controllable current source 217 is a common-mode feedback circuit to adjust the common mode voltage at nodes 215a, 215b. According to further embodiments, other implementations of this common-mode feedback circuit are also possible.

For applying the calibration input signal 109a, 109b to the RF-input 101a, 101b, the RF-demodulator 200 may comprise two switches SW1, SW2 being coupled between the RF-input 101a, 101b and an output of the calibration circuitry 107. The switches SW1, SW2 may be coupled to the RF-input 101a, 101b using resistors R3, R4. In the example shown in FIG. 2, a third resistor R3 is coupled between the switch SW1 and the first RF-input node 101a and a fourth resistor R4 is coupled between the switch SW2 and the second RF-input node 101b. For applying the calibration input signal 109a, 109b to the RF-input nodes 101a, 101b, the calibration circuitry 107 may close the switches SW1, SW2 (put their controlled paths into a low impedance state). For decoupling the calibration circuitry 107 from the RF-input 101a, 101b, the calibration circuitry 107 may open the switches SW1, SW2 (put their controlled paths into a high impedance state).

Furthermore, the mixer input stage 201 may comprise a transistor N5, a control terminal of which being coupled to its drain or collector terminal. The drain terminal or the collector terminal of the transistor N5 may be connected to a current source providing a reference current Iref. The transistor N5 may be configured to provide a biasing point for the first group of transistors N1 and the second group of transistors N2, for example, when the mixer input stage 201 is not in a calibration mode, e.g. when the switches SW1, SW2 are opened, and therefore in a high impedance state. The control terminal N5 may be switchably coupled through a fifth resistor R5 and a switch SW4 to the fourth resistor R4 and furthermore through the fifth resistor R5 and a switch SW3 to the third resistor R3.

Furthermore, the mixer input stage 201 may comprise a first input capacitor C1 coupled to the first RF-input node 101a, and a second input capacitor C2 coupled to the second RF-input node 101b. The RF-input nodes 101a, 101b, may be configured to be coupled to an antenna circuit or an antenna using the capacitors C1, C2. As an example, the RF-input nodes 101a, 101b may get coupled to the antenna circuit or the antenna through a preceding stage in front of the mixer input stage 201 (e.g. coupled between the RF-input nodes 101a, 101b and the antenna circuit or the antenna), such as a low noise amplifier (LNA). The capacitors C1, C2 may remove a DC offset of a received RF-input signal, such that the RF-input signal 113a, 113b is DC offset free.

As mentioned before, the RF-demodulator comprises the mixer core 203, being coupled between the mixer input stage 201 and the active filtering stage 205. The mixer core 203 may be configured to receive the first intermediate calibration signal 209a, 209b, and to provide a second intermediate calibration signal 221a, 221b at an output 223a, 223b of the mixer core 203.

The mixer core 203 may be configured to receive an RF signal, for example, an amplified version of the RF-input signal 113a, 113b and perform a mixing based on the received RF signal, to provide a mixed RF signal at its output 223a, 223b. As the mixer input stage 201, the mixer core 203 may perform this mixing with differential signals. As an example, the mixer core 203 may perform a mixing based on a differential RF signal received at the differential input 225a, 225b of the mixer core 203 and a differential oscillator signal 227a, 227b received at a differential oscillator signal input 229a, 229b of the mixer core 203, to derive a differential mixer out-put signal at its differential output 223a, 223b.

The oscillator input signal 227a, 227b and the received RF signal may be AC signals.

For establishing a signal path through the mixer core 203, the calibration circuitry 207 may be configured to apply a bias signal 231a, 231b (also designated as VLObias+, VLObias−) to the oscillator signal input 229a, 229b of the mixer core 203. The calibration circuitry 107 may be configured to provide the bias signal 231a, 231b as a DC signal.

Furthermore, the calibration circuitry 107 may be configured to apply the bias signal 231a, 231b to the oscillator signal input 231a, 231b of the mixer core 203.

As shown in FIG. 2, the mixer core 203 may comprise four mixing transistors N6 to N9.

Control terminals of a first mixing transistor N6 and a fourth mixing transistor N9 are coupled to a first oscillator signal input node 229a of the mixer core 203 and control terminals of a second mixing transistor N7 and a third mixing transistor N8 are coupled to a second oscillator signal input node 229b of the mixer core 203.

A controlled path of the first mixing transistor N6 is coupled between the second input node 225b of the mixer core 203 and the second output node 223b of the mixer core 203. A controlled path of the second mixing transistor N7 is coupled between the second input node 225b of the mixer code 203 and the first output node 223a of the mixer core 203. A controlled path of the third mixing transistor N8 is coupled between the first input node 225a of the mixer core 203 and the second output node 223b of the mixer core 203. A controlled path of the fourth mixing transistor NO is coupled between the first input node 225a of the mixer core 203, and the first output node 223a of the mixer core 203.

The calibration circuitry 207 may be configured to provide the bias signal 231a, 231b such that either the controlled paths of the first mixing transistor N6 and the fourth mixing transistor N9 are in a low impedance state and the controlled paths of the second mixing transistor N7 and the third mixing transistor N8 are in a high impedance state, or such that the controlled paths of the first mixing transistor N6 and the fourth mixing transistor NO are in a high impedance state and the controlled paths of the second mixing transistor N7 and the third mixing transistor N8 are in a low impedance state.

In this manner, the calibration circuitry 107 establishes a signal path through the mixer core 203 for the first intermediate calibration part signal 209a and the second intermediate calibration part signal 209b from the input 225a, 225b of the mixer core 203 to the output 223a, 223b of the mixer core 203.

For activating either the controlled paths of the first mixing transistor N6 and the fourth mixing transistor N9, or of the second mixing transistor N7 and the third mixing transistor N8, the calibration circuitry 107 may provide the bias signal 231a, 231b as a differential or complementary signal. As an example, the calibration circuitry 107 may apply supply voltage VDD at the first oscillator signal input node 229a and may apply a ground potential at the second oscillator signal input node 229b, or vice versa.

To summarize, the mixer core 203 comprises different signal paths from its input 225a, 225b to its output 223a, 223b and the calibration circuitry 107 activates a signal path through the mixer core 203 for the first part 209a of the first intermediate calibration signal 209a, 209b and another signal path for the second part 209b of the first intermediate calibration signal 209b, 209b. The first part 209a and the second part 209b of the first intermediate calibration signal 209a to 209b may be currents.

The calibration circuitry 107 may provide the bias signal 231a, 231b using a sixth resistor R6 coupled between the calibration circuitry 107 and the first oscillator signal input node 229a and using a seventh resistor R7 coupled between the calibration circuitry 107 and the second oscillator signal input node 229b. According to further embodiments, these resistors R6, R7 may be omitted.

The oscillator signal 227a, 227b may be provided to the mixer core 203 using a third capacitor C3, coupled to the first oscillator signal input node 229a, and a fourth capacitor C4, coupled to the second oscillator signal input node 229b.

As mentioned before, the demodulator 200 may comprise the active filtering stage 205, coupled between the mixer core 203 and the RF-output 103a, 103b.

The active filtering stage 205 may be configured to perform a current to voltage conversion (e.g. as a transimpedance amplifier) and an active filtering of a signal received at its input 235a, 235b.

The active filtering stage 205 comprises an eighth resistor R8 and a fifth capacitor C5, both coupled between a first input node 235a of the mixer core 203 and the first RF-output node 103a.

Furthermore, the active filtering stage 205 comprises a sixth capacitor C6 and a ninth resistor R9, coupled between a second input node 235b of the active filtering stage 205 and the second RE-output node 103b.

Furthermore, the active filtering stage 205 comprises an amplifier 233 coupled between the input 235a to 235b of the active filtering stage 205 and the RF-output 103a, 103b.

The gain of the mixing and amplification stage is not only influenced by the transconductance of the input circuits 207 of the mixer input stage 201, but also by the load resistors R8, R9 of the active filtering stage 205.

As can be seen from FIG. 2, the amplifier 233 is configured to receive and amplify the second intermediate calibration signal 221a, 221b from the mixer core 103 and provide the calibration output signal 111a, 111b at the RF-output 103a, 103b.

In other words, a gain of the active filtering stage 205 is based on the values of the load resistance R8, R9.

The calibration circuitry 107 may comprise an ADC (analog-to-digital converter) 237, a control unit 239 and a calibration signal provider 241.

The ADC 237 may be coupled to the RF-output 115a, 115b or example, using a fifth switch SW5 and a sixth switch SW6 for sensing the calibration output signal 111a, 111b. In the example shown in FIG. 2, the calibration output signal 111a, 111b is a calibration output voltage. The ADC 237 may perform an analog-to-digital conversion of the calibration output signal 111a, 111b and may provide a result of the analog-to-digital conversion to the control unit 239.

The control unit 239 may provide a control signal for the calibration signal provider 241, based on which the calibration signal provider 241 provides the calibration input signal 109a, 109b. In the example shown in FIG. 2, the calibration signal provider 241 is coupled to the nodes A, B, which are coupled through the switches SW1, SW2 and the resistors R3, R4 to the RF-input 101a, 101b of the RF-demodulator 200. As an example, the calibration signal provider 241 may be a DAC (digital-to-analog converter). The control unit 239 may derive the gain of the mixing and amplification stage based on the relationship between the calibration output signal 111a, 111b (sensed and a digitized by ADC 237) and the calibration input signal provided 109a, 109b by the calibration signal provider 241.

As an example, the gain may be derived as:

$$\text{gain} = \frac{\text{calibration output signal}}{\text{calibration input signal}}. \quad (1)$$

Based on the derived gain, the control unit 239 may be configured to calibrate the mixing and amplification stage. In the example shown in FIG. 2, the control unit 239 may be configured to change the transconductances of the input circuit 207 of the mixer input stage 201, by selectively activating or deactivating input transistors of the plurality of input transistors N1, N2 (e.g. by closing or opening the switches SW7, SW8).

Furthermore, the control unit 239 may be configured to provide the bias signal 231a, 231b to the mixer core 203, for establishing a signal path through the mixer core 203 during a calibration.

According to further embodiments, the control unit 239 may be configured to adjust a current of the plurality of input transistors N1, N2 by adjusting a current mirror coupled to the plurality of input transistors N1, N2.

Furthermore, the control unit 239 may be configured to adjust the gain of the mixing and amplification stage by changing the values of the lower transistors R8, R9 of the active filtering stage 205. This will be described in more detail using FIG. 4.

In further embodiments, a control unit and a mixing and amplification stage of an RF-demodulator may be configured to perform one, some, or all of these functionalities to calibrate the gain of the mixing and amplification stage.

In the following, the function of the RF-demodulator 200 shown in FIG. 2 will be summarized.

The gain of a demodulator comprising the mixer input stage 201, the mixer core 203 and the active filtering stage 205 is prone to process and temperature variations, resulting in gain variations due to a deviation of the transconductance of the transistors N1, N2 and the resistance values of the resistors R8 and R9 from their target values. With the introduced method in embodiments, the complete gain of the demodulator 200 can be calibrated, for example, for different process corners (e.g. slow, fast, etc.) and temperatures. Furthermore, an in-system calibration, e.g. when the RF-demodulator 200 is connected to an antenna circuit and a receiver circuit can be achieved.

With the suggested method in embodiments, the deviation of the total demodulation gain from the target value can be measured and these gain errors, for example, originating from the temperature and process variations can be calibrated. This can be done by applying a DC offset voltage (the calibration input signal 109a, 109b) at the input 101a, 101b of the mixer input stage 201, and measuring the amplified DC offset voltage (the calibration output signal 11a, 111b) at the output 103a, 103b of the transimpedance amplifier 233 or the active filter 205 by the ADC 237 which may already be available on the chip. The deviation of the measured DC gain from the target gain value can be corrected by changing the number of parallel connected (input) transistors N1, N2. By changing the current or the total gate width or both, the current and the total gate width of the transistors N1, N2, the transconductance of N1 and N2 can be corrected. Alternatively, or additionally, the resistance values of the resistors R8 and R9 can be altered to correct the gain. This method enables a calibration of the gain of a demodulator directly by measuring the gain of the actual demodulator circuit without any additional test circuits.

An idea of embodiments is to detect the total gain deviation of the demodulator 200 from the target gain and to calibrate the gain by increasing/decreasing the number of transistors N1, N2 at the mixer input stage 201 and/or changing the load resistors R8 and R9 in the active filtering stage 205 to correct the gain. The gain calibration is carried out within the actual demodulator 200 by applying a DC offset (the calibration input signal 109a, 109b) at the mixer input stage 201 and measuring the amplified DC offset voltage (the calibration output signal 111a, 111b) at the active filter output (which is also the RE-output 103a, 103b). This gain calibration method has a high accuracy.

The demodulator 200 with gain detection and calibration circuitry 107 works as follows:

At the beginning of the calibration, the switches SW1, SW2, SW5, and SW6 are closed (are in a low impedance state) and switches SVV3 and SW4 are opened (are in a high impedance state). Afterwards, a DC voltage (VDC_in) between the nodes A and B is applied to the input of N1 and N2 (e.g. through the resistors R3, R4). As will be shown using FIG. 5, VDC_in can be derived from voltage dividers.

After having turned off the LO buffers (not shown in figures) which can be connected to the mixer core 203 (e.g. to the oscillator signal input 229a, 229b using the capacitor C3, C4), or in other words, the gates of the transistors N6, N7, N8 and N9, VLObias+ and VLObias− can be made equal to VDD and a reference voltage (e.g. Vref or VSS), respectively.

This turns the transistors N6 and N9 on and the transistors N7 and N8 off. The currents flowing through the transistors N6 and N9 are different due to the voltage VDC_in applied between the nodes A and B. These currents flow through the feedback resistors R8 and R9 and generate the voltage VDC_out (the calibration of output signal 111a, 111b) at the output 103a, 103b of the active filter or the active filtering stage 205. From VDC out and VDC_in, the DC gain of the demodulator is measured by the ADC 237. Dividing the calibration input signal 109a, 109b by the calibration output signal 111a, 111b (e.g. VDC_out by VDC_in) yields the gain of the demodulator 200. If the measured gain is divided by the value of the load resistors R8, R9, the transconductance of the transistors N1, N2 in the mixer input stage 201 can be calculated. Depending on the gain deviation from the target gain, an appropriate number of parallel connected transistors (of the input circuit 207) are activated (e.g. by closing the switches SW7, SW8).

The calibration input signal 109a, 109b can be provided to the RF-input 101a, 101b through the resistors R3, R4, by applying a signal, for example, a voltage VDC_in to the resistors R3, R4. Therefore, the calibration input signal 109a, 109b is based on the signal VDC_in and can be equal to this, when assuming a high impedance of the control terminals of the plurality of transistors N1, N2. Therefore, the signal VDC_in is also designated as calibration input signal. The calibration input signal VDC_in can be a voltage, therefore, the calibration input signal VDC_in may be designated as calibration input voltage, also.

Further embodiments provide an RF-demodulator comprising an active filtering stage, the active filtering stage comprising at least a first load resistance and an amplifier, an output of the amplifier being coupled to the RF-output. The amplifier is configured to receive and amplify the calibration input signal or a second intermediate calibration input signal, which is based on the calibration input signal to provide the calibration output signal at the RF-output. A gain of the active filtering stage is based on the value of the load resistor. The calibration circuitry of the RF-demodulator is configured to switch between different resistance values of the load resistor. As an example, the active filtering stage may comprise a resistor network, and the calibration circuitry may be configured, to selectively activate and deactivate resistors of the resistor network, based on the derived gain of the mixing and amplification stage.

FIG. 3 shows a block schematic diagram of a demodulator 300 according to a further embodiment. The demodulator 300 differs from the demodulator 200 in that it comprises a mixer input stage 301 which is a differential common source amplifier with an (adjustable) current mirror.

The mixer input signal 301 differs from the mixer input stage 201 in FIG. 2 in that it has a different input circuit 307. The input circuit 307 differs from the input circuit 207 in that it comprises a first input transistor N1, a control terminal of which is coupled to the first RF-input node 101a and a second input transistor N2, a control terminal of which is coupled to the second RF-input node 101b. Source terminals or mitter terminals of the input transistors N1, N2 are switchably coupled to drain terminals or collector terminals of a plurality of current mirror transistors N10.

Controlled paths of the current mirror transistors N10 are switchably coupled between the drain terminals or collector terminals of the input transistors N1, N2 and the reference potential terminal VSS.

Control terminals of the current mirror transistors N10 are coupled to the control terminal and the drain terminal of the transistor N5.

Therefore, the transistor N5 creates a current mirror together with the plurality of transistors N10. A current flowing along the controlled paths of the input transistors N1, N2 can be adjusted by coupling and decoupling of current mirror transistors of the plurality of current mirror transistors N10 to the input transistors N1, N2.

As an example, a first current mirror transistor 311 of the plurality of current mirror transistors N10 may be coupled constantly between the reference potential terminal VSS and the input transistors N1, N2. A second current mirror transistor 313 of the plurality of current mirror transistors N10 can be switchably coupled (using a switch SVV9) between the reference potential VSS and the input transistors N1, N2. For adjusting a gain of the input circuit 307, the control unit 239 may open and close the switch SVV9 based on the derived gain of the mixing and amplification stage (comprising the mixer input stage 301, the mixer core 203 and the active filtering stage 205) of the demodulator 300. According to further embodiments, the input circuit 307 may comprise more than the two transistors shown within the plurality of current mirror transistors N10. Each of the plurality of transistors N10 may be switchably coupled to the input transistors N1, N2 (e.g. using a plurality of switches). The switches may be controllable by the control unit 239 based on the derived gain of the mixing and amplification stage.

According to further embodiments, switches for coupling the plurality of current mirror transistors N10 may be placed between said drain terminals or collector terminals of the current mirror transistors N10 and the source terminals or emitter terminals of the input transistors N1, N2 and/or between the source terminals or emitter terminals of the current mirror transistor N10 and the reference potential terminal VSS.

To summarize, the gain of the demodulator 300 shown in FIG. 3 can be calibrated by changing the reference current Iref or the number of transistors in the transistor array N10 (the number of current mirror transistors of the plurality of current mirror transistors N10 coupled to the input transistors N1, N2).

According to further embodiments, instead of having a plurality of current mirror transistors N10 or in addition to the plurality of current mirror transistors N10, the control unit 239 may change the reference current Iref of the current mirror.

As an example, in a further embodiment, the input circuit 307 may comprise only one current mirror transistor, a control terminal of which is coupled to a control terminal and a drain terminal or collector terminal of the transistor N5. The control unit 239 may adjust the reference current Iref based on the derived gain of the mixing and amplification stage of the demodulator 300.

Alternatively, the mixer input stages 201, 301 can be implemented with a variety of amplifiers including, but not limited to, a differential common source or a push-pull mixer stage.

Figure 4:
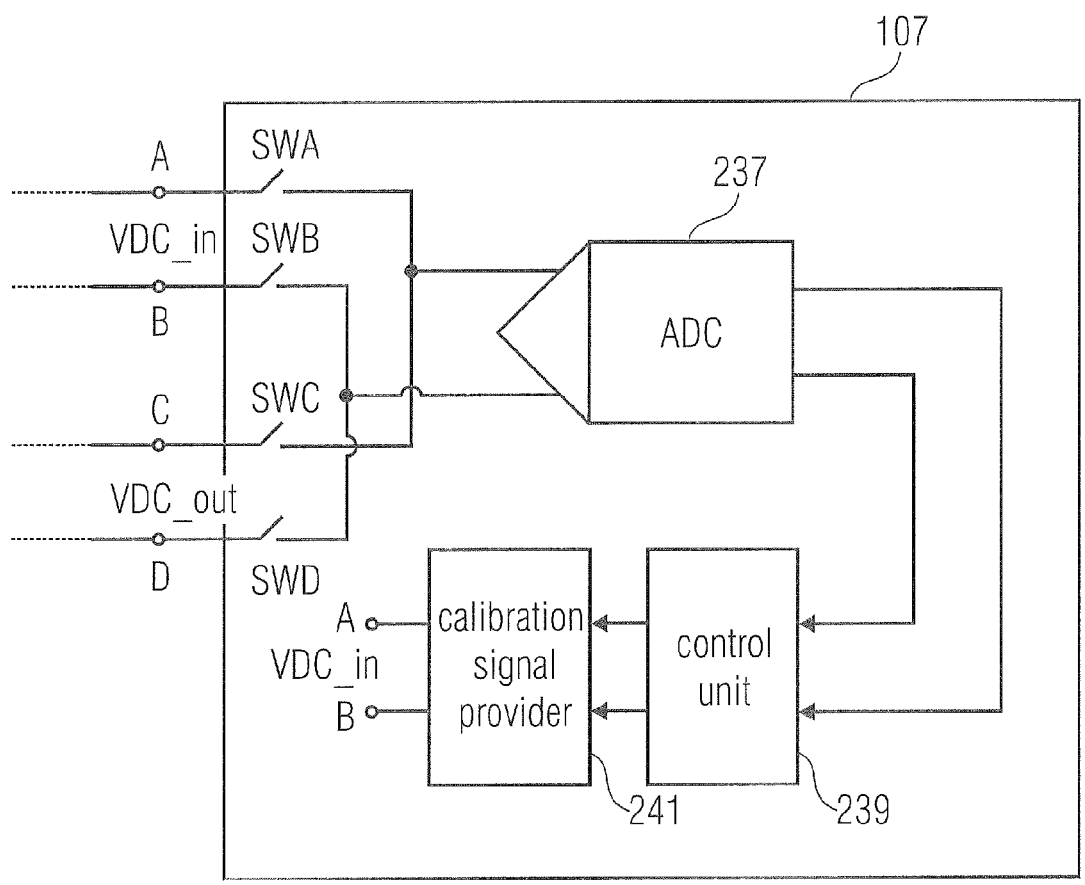
FIG. 4 shows an equivalent circuitry showing how to couple a calibration input signal and a calibration output signal to a common ADC.

Although the accuracy of VDC_in depends on the matching of the voltage divider resistors (see FIG. 5) and should be well-known without a measurement, in further embodiments VDC_in can additionally be measured by an ADC, as shown in FIG. 4. This ADC may already be available on the chip as a part of the receiver at the output of the analog portion of the receiver.

FIG. 4 shows an alternative realization for connecting the ADC 237 in a calibration circuitry. This alternative implementation may be implemented in the RF-demodulators 200, 300. The implementation shown in FIG. 4 differs from the implementation in the RF-demodulators 200, 300, in that a common ADC 237 is provided for sensing the calibration output signal VDC_out and the calibration input signal VDC_in. As an example, in the first phase, switches SWA, SWB are closed, such that the nodes A, B are connected to the ADC 237, while the switches SWC, SWD are opened. Therefore the nodes C, D and the calibration output signal VDC_out are decoupled from the ADC 237. In this first phase the ADC 237 may sense the calibration input signal VDC_in. In a second phase, the calibration circuitry 107 may be configured to couple the calibration output signal VDC_out to the ADC 237, for example, by opening the switches SWA, SWB, and closing switches SWC, SWD to decouple the nodes A, B from the ADC 237. In the second phase, the ADC 237 may sense the calibration output signal VDC_out. In other words, the calibration unit may be configured, in the first phase, to couple the ADC 237 to the RF-input 109a, 109b for measuring the calibration input signal VDC_in and, in a second phase, couple the ADC 237 to the RF-output 103a, 103b for measuring the calibration output signal VDC_out.

By having the common ADC 237 for the calibration input signal VDC_in and the calibration output signal VDC_out, one extra ADC can be saved.

To summarize, FIG. 4 shows a switch arrangement to measure VDC_in and VDC_out by one common ADC.

Figure 5:
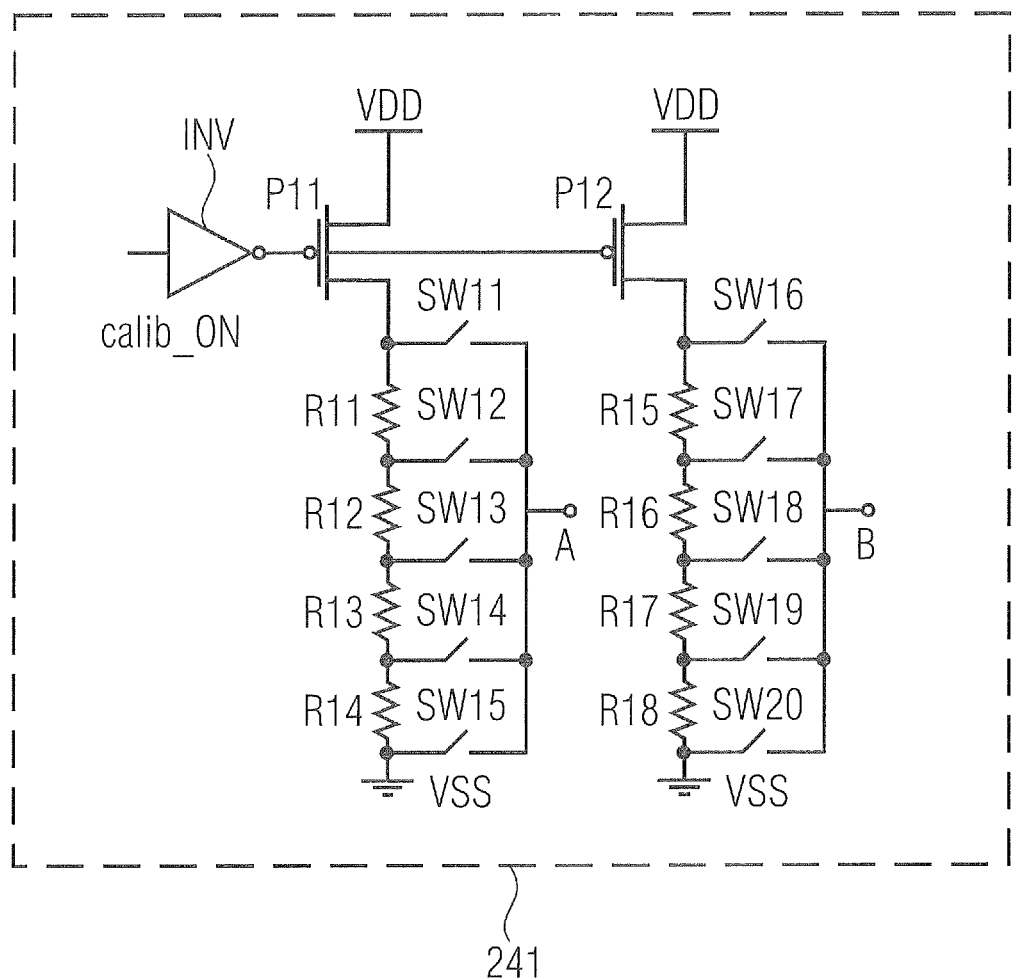
FIG. 5 shows an equivalent circuitry configured to generate a calibration input signal and how it may be implemented into a calibration circuitry according to an embodiment.

FIG. 5 shows an equivalent circuit of voltage dividers for generating the calibration input voltage VDC_in between the nodes A and B. In one embodiment the equivalent circuit shown in FIG. 5 can be part of the calibration signal provider 241, and may comprise an inverter INV being coupled to a control terminal of a first signal provider transistor P11 and a control terminal of a second signal provider transistor P12. A controlled path of the first signal provider transistor P11 is coupled between a supply voltage terminal VDD and a first resistive ladder. A controlled path of the second signal provider transistor P12 is coupled between the supply voltage terminal VDD and a second resistive ladder.

The first resistive ladder being coupled between the first signal provider transistor P11 and a ground terminal VSS comprises a series connection of resistors R11 to R14 and switches SW11 to SW15, which are coupled between the node A and terminals of the resistors R11 to R14.

The second resistive ladder, being coupled between the second signal provider transistor P12 and the ground terminal VSS comprises a series connection of resistors R15 to R18 and switches SW16 to SW20 coupled between the node B and terminals of the resistors R15 to R18. The calibration signal provider 241 may be configured to adjust the calibration output signal VDC_in by closing or opening the switches SW11 to SW20. As an example, the control unit 239 may provide one or more control signals, based on which the calibration signal provider 241 closes or opens dedicated switches SW11 to SW20 to adjust the calibration input signal VDC_in.

If the demodulator has a DC offset due to mismatch effects or layout inaccuracies, this may lead to an error in the calibration result. To avoid this error, the calibration can be done in two steps. In a first step, the DC offset (a calibration input signal 109a, 109b) is applied at the mixer input 101a, 101b, as already described in the previous sections. In the second step, the sign of the DC offset (of the calibration input signal 109a, 109b) is changed, in other words a negative DC voltage is applied at the mixer input 101a, 101b with the switches SW11 to SW20 shown in FIG. 5.

The use of the differential concept shown in FIG. 5 enables a very simple switching of the sign of the calibration input voltage 109a, 109b. By subtracting the two DC offset voltages from these two steps and dividing the result by two, the influence of the demodulator offset voltages, due to mismatch or layout inaccuracies can be eliminated.

To summarize, according to some embodiments, the calibration circuitry may be configured to vary an absolute value of the calibration input signal 109a, 109b.

According to further embodiments, the calibration circuitry may be configured to change a sign of the calibration input signal 109a, 109b.

The voltage divider shown in FIG. 5 to implement the offset voltage at VDC_in is just an example, as the number of resistors R12-R18 in the voltage divider in FIG. 5 can be decreased or increased, depending on how many different offset voltages need to be implemented.

Figure 6:
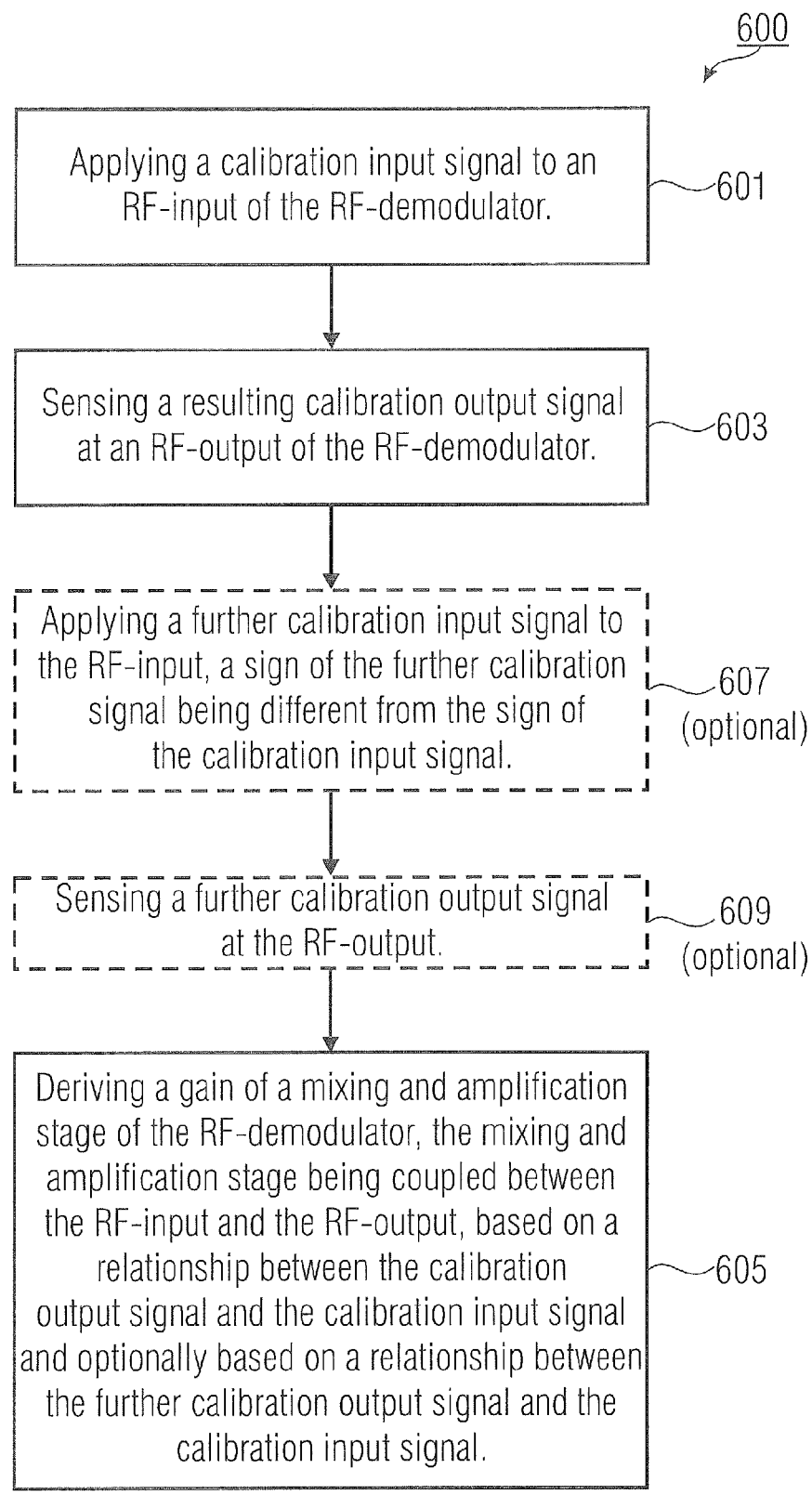
FIG. 6 shows a flow diagram of a method according to a further embodiment.

FIG. 6 shows a flow diagram of a method 600 for calibrating an RF-demodulator.

The method 600 comprises a step 601 of applying a calibration input signal to an RF-input of the RF-demodulator.

Furthermore, the method 600 comprises a step 603 of sensing a resulting calibration output signal at an RF-output of the RF-demodulator.

Furthermore, the method 600 comprises a step 605 of deriving a gain of a mixing and amplification stage of the RF-demodulator, the mixing and amplification stage being coupled between the RF-input and the RF-output, based on the relationship between the calibration output signal and the calibration input signal.

The method 600 may be performed by the RF-demodulators described above.

According to further embodiments, the method 600 may also comprise a step 607 of applying a further calibration input signal to the RF-input, a sign of the further calibration input signal being different from a sign of the calibration input signal.

Furthermore, the method may also comprise a step 609 of sensing a further calibration output signal at the RF-output of the demodulator.

When the optional steps 607, 609 are used in the method 600 then, during the step 605, the gain may further be determined based on a relationship between the further calibration input signal and the further calibration output signal.

By performing these additional steps 607, 609, a DC offset of the demodulator in the determined gain can be reduced or eliminated. The additional 607, 609 steps may be performed before the step 605.

The additional steps 607, 609 may, for example, be performed using the voltage divider shown in FIG. 6.

Figure 7:
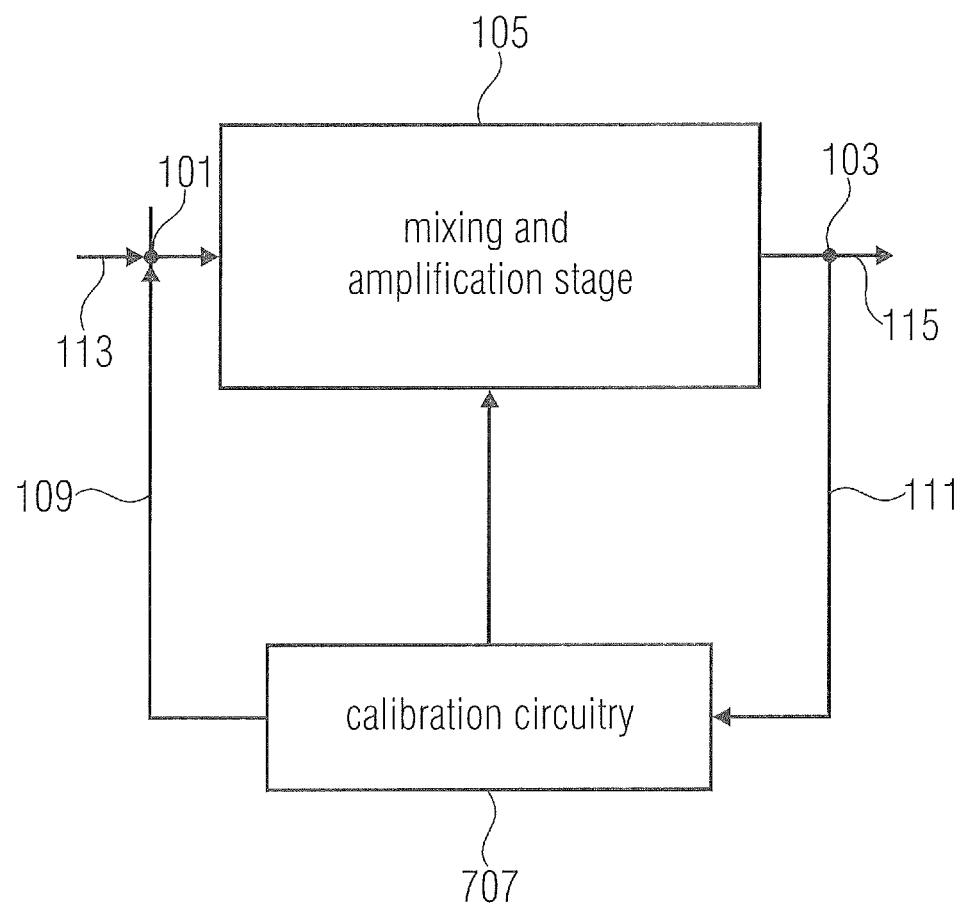
FIG. 7 shows a block schematic diagram of a calibration circuitry according to an embodiment coupled to an RF-demodulator.

FIG. 7 shows a block schematic diagram of a calibration circuitry 707 for a demodulator. The calibration circuitry may be coupled to an RF-input 101 and an RF-output 103 of the RF-demodulator. The RF-demodulator may comprise a mixing and amplification stage between the RF-input 101 and the RF-output 103. The calibration circuitry 707 is configured to apply a calibration input signal 109 at the RF-input 101 and sense a resulting calibration output signal 111 at the RF-output. Furthermore, the calibration circuitry 707 is configured to derive a gain of the mixing and amplification stage based on a relationship between the calibration output signal 111 and the calibration input signal 109. Furthermore, the calibration circuitry 707 is configured to switch between different configurations of the mixing and amplification stage 105 based on the derived gain of the mixing and amplification stage 105, for example, to perform a calibration of the mixing and amplification stage 105.

The calibration circuitry 707 may comprise further optional features, for example, which have been described in conjunction with the calibration circuitry 107.

Figure 8:
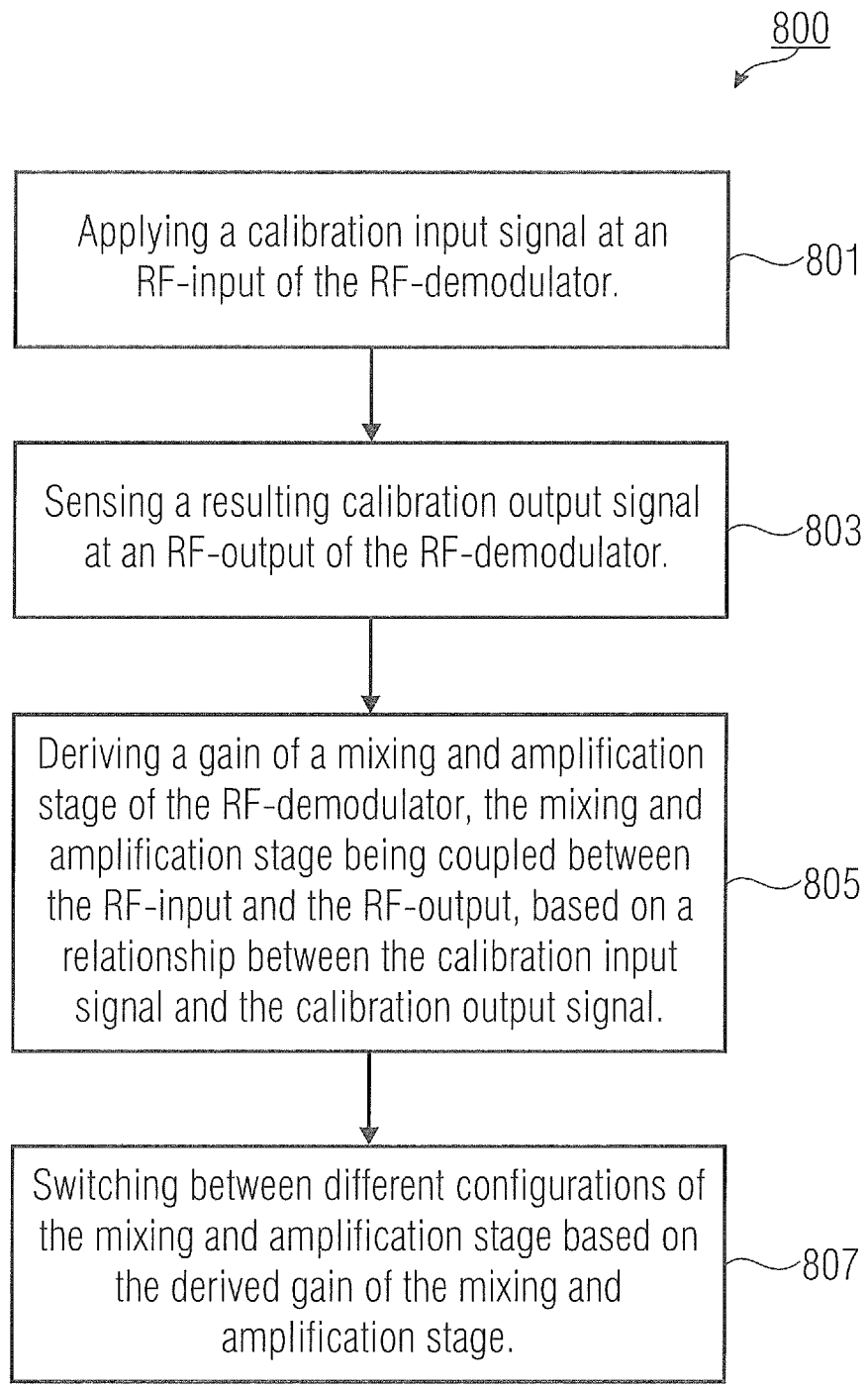
FIG. 8 shows a flow diagram of a method for calibrating an RF-demodulator according to a further embodiment.

FIG. 8 shows a flow diagram of a method 800 for calibrating an RF-demodulator, the method comprising a step 801 of applying a calibration input signal at an RF-input of the demodulator.

Furthermore, the method 800 comprises a step 803 of sensing a resulting calibration output signal at an RF-output of the RF-demodulator.

Furthermore, the method 800 comprises a step 805 of deriving a gain of a mixing and amplification stage of the RE-demodulator, the mixing and amplification stage being coupled between the RF-input and the RE-output, based on a relationship between the calibration input signal and the calibration output signal.

Furthermore, the method 800 comprises a step 807 of switching between different configurations of the mixing and amplification stage based on the derived gain of the mixing and amplification stage.

The method 800 may be performed by the calibration circuitry 707, but also by the calibration circuitry 107 described above.

To summarize, embodiments provide a gain calibration method of a de-modulator with an insitu measurement. The gain calibration method enables a small gain, noise figure and linearity variation over process and temperature.

Switches of RF-demodulators according to embodiments may be implemented as single transistors, transmission gates, relays or also as micro-electromechanical (MEMS) switches.

RF-demodulators according to embodiments may be fabricated with various IC process technologies such as complementary metal oxide semiconductor (CMOS), N-channel MOS (NMOS), P-channel MOS (PMOS), bipolar junction transistor (BJT), bipolar CMOS (BiCMOS), silicon germanium (SiGe), gallium arsenide (GaAs), hetero-junction bipolar transistor (HBT), etc.

The transistors N1 to N9 may be NMOS transistors and the transistors P1, P2, P11, P12 may be PMOS transistors. According to further embodiments, other types of transistors, such as bipolar transistors, may be used too. In addition, a complementary realization may also be possible.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The invention claimed is:

1. An RF-demodulator comprising:
an RF-input;
a demodulator output;
a mixing and amplification stage coupled between the RF-input and the demodulator output; and
a calibration circuitry configured to apply a calibration input signal at the RF-input and to sense a resulting calibration output signal at the demodulator output to derive a gain of the mixing and amplification stage based on a relationship between the calibration output signal and the calibration input signal,
wherein the mixing and amplification stage comprises a mixer input stage coupled to the RF-input, the mixer input stage being configured to amplify the calibration input signal and provide a first intermediate calibration signal at an output of the mixer input stage.

2. The RF-demodulator according to claim 1, wherein calibration circuitry is configured to switch between different configurations of the mixing and amplification stage based on the derived gain of the mixing and amplification stage.

3. The RF-demodulator according to claim 1, wherein the mixing and amplification stage is configured to mix and amplify an RF-input signal received at the RF-input to provide an output signal at the demodulator output as a mixed and amplified version of the RF-input signal.

4. The RF-demodulator according to claim 1, wherein the mixer input stage is further configured to amplify an RF signal received at the RF-input and provide a first intermediate RF signal at the output of the mixer input stage; and
wherein the mixer input stage is configured to use one and the same signal path for amplifying the calibration input signal and the received RF-input signal.

5. The RF-demodulator according to claim 1:
wherein the calibration circuitry is configured to provide the calibration input signal as a differential signal; and
wherein the mixer input stage is configured to receive the calibration input signal as a differential signal and provide the first intermediate calibration signal as a differential signal.

6. The RF-demodulator according to claim 1, wherein the calibration circuitry comprises an analog-to-digital converter configured to measure the calibration input signal and the calibration of the output signal.

7. An RF-demodulator comprising:
an RF-input;
a demodulator output;
a mixing and amplification stage coupled between the RF-input and the demodulator output; and
a calibration circuitry configured to apply a calibration input signal at the RF-input and to sense a resulting calibration output signal at the demodulator output to derive a gain of the mixing and amplification stage based on a relationship between the calibration output signal and the calibration input signal,
wherein the mixing and amplification stage comprises an input circuit being coupled to the RF-input;
wherein the calibration circuitry is configured to switch between different configurations of the input circuit based on the derived gain of the mixing and amplification stage; and
wherein different configurations of the input circuit correspond to different gains applied to the calibration input signal.

8. An RF-demodulator comprising:
an RF-input;
a demodulator output;
a mixing and amplification stage coupled between the RF-input and the demodulator output; and
a calibration circuitry configured to apply a calibration input signal at the RF-input and to sense a resulting calibration output signal at the demodulator output to derive a gain of the mixing and amplification stage based on a relationship between the calibration output signal and the calibration input signal,
wherein the mixing and amplification stage comprises an input circuit coupled to the demodulator output; and
wherein the calibration circuit is configured to switch between different transconductances of the input circuit based on the derived gain of the mixing and amplification stage,
wherein the input circuit comprises a plurality of input transistors, control terminals of which are coupled to the RF-input; and
wherein the calibration circuit is configured to switch between the different transconductances by selectively activating and deactivating input transistors of the plurality of input transistors based on the derived gain of the mixing and amplification stage.

9. The RF-demodulator according to claim 8:
wherein controlled paths of the input transistors are switchably coupled between a reference potential terminal and an output of the input circuit; and
wherein the calibration circuitry is configured to activate an input transistor of the plurality of input transistors by coupling the transistor's controlled path between the reference potential terminal and the output of the input circuit and deactivate the input transistor by decoupling the transistor's controlled path from the reference potential terminal or the output of the input circuit.

10. An RF-demodulator comprising:
an RF-input;
a demodulator output;
a mixing and amplification stage coupled between the RF-input and the demodulator output; and
a calibration circuitry configured to apply a calibration input signal at the RF-input and to sense a resulting calibration output signal at the demodulator output to derive a gain of the mixing and amplification stage based on a relationship between the calibration output signal and the calibration input signal,
wherein the mixing and amplification stage comprises a mixer core; and
wherein the calibration circuitry is configured to apply a bias signal to the mixer core for establishing a signal path between the RF-input and the demodulator output through the mixer core.

11. The RF-demodulator according to claim 10:
wherein the mixer core comprises an oscillator signal input configured to receive an oscillator signal;
wherein the mixer core is configured to perform a mixing based on the oscillator signal received at its oscillator signal input; and
wherein the calibration circuitry is configured to apply the bias signal to a bias signal input of the mixer core.

12. The RF-demodulator according to claim 11:
wherein the mixer core is configured to receive the oscillator signal as a differential signal at its oscillator signal input; and
wherein the calibration circuitry is configured to provide the bias signal as a differential signal at the bias signal input.

13. The RF-demodulator according to claim 10, wherein the mixer core is configured to receive the calibration input signal or a first intermediate calibration signal, which is based on the calibration input signal at a bias signal input, and wherein the mixer core also receives RF-signals that are to be mixed by the mixer core with an oscillator signal received at an oscillator signal input of the mixer core.

14. An RF-demodulator comprising:
an RF-input;
a demodulator output;
a mixing and amplification stage coupled between the RF-input and the demodulator output; and
a calibration circuitry configured to apply a calibration input signal at the RF-input and to sense a resulting calibration output signal at the demodulator output to derive a gain of the mixing and amplification stage based on a relationship between the calibration output signal and the calibration input signal,
wherein the calibration circuitry is configured to provide the calibration input signal as a DC signal to the RF-input of the demodulator; and
wherein the mixing and amplification stage is configured to provide the calibration output signal as a DC signal at the demodulator output.

15. An RF-demodulator comprising:
an RF-input;
a demodulator output;
a mixing and amplification stage coupled between the RF-input and the demodulator output; and
a calibration circuitry configured to apply a calibration input signal at the RF-input and to sense a resulting calibration output signal at the demodulator output to derive a gain of the mixing and amplification stage based on a relationship between the calibration output signal and the calibration input signal,
wherein the mixing and amplification stage comprises an active filtering stage coupled to the demodulator output for providing the calibration output signal; and
wherein the calibration circuitry is configured to switch between different configurations of the active filtering stage, based on the derived gain of the mixing and amplification stage.

16. The RF-demodulator according to claim 15, wherein the calibration circuitry is configured to switch between different load resistances of the active filtering stage based on the derived gain of the mixing and amplification stage.

17. An RF-demodulator comprising:
an RF-input;
a demodulator output;
a mixing and amplification stage coupled between the RF-input and the demodulator output; and
a calibration circuitry configured to apply a calibration input signal at the RF-input and to sense a resulting calibration output signal at the demodulator output to derive a gain of the mixing and amplification stage based on a relationship between the calibration output signal and the calibration input signal,
wherein the calibration circuitry comprises an analog-to-digital converter configured to measure the calibration input signal and the calibration of the output signal,
wherein the calibration circuitry is configured to, in a first phase, couple the analog-to-digital converter to the RF-input to measure the calibration input signal, and in a second phase, couple the analog-to-digital converter to the demodulator output to measure the calibration output signal.

18. An RF-demodulator comprising:
an RF-input;
a demodulator output;
a mixing and amplification stage coupled between the RF-input and the demodulator output; and
a calibration circuitry configured to apply a calibration input signal at the RF-input and to sense a resulting calibration output signal at the demodulator output to derive a gain of the mixing and amplification stage based on a relationship between the calibration output signal and the calibration input signal,
wherein the mixer input stage comprises an input transistor, a control terminal of which being coupled to the RF-input;
wherein the mixer input stage further comprises a current mirror coupled to a controlled path of the input transistor; and
wherein the calibration circuitry is configured to switch between different configurations of the current mirror based on the derived gain.

19. The RF-demodulator according to claim 18:
wherein the current mirror comprises a plurality of current mirror transistors configured to adjust a current of the input transistor; and
wherein the calibration circuitry is configured to selectively couple and decouple controlled paths of one or more of the current mirror transistors to or from the input transistor or to or from a reference potential terminal VSS, respectively, based on the derived gain.

20. Calibration circuitry for an RF-demodulator, the RF-demodulator comprising an RF-input for receiving an RF-input signal, a demodulator output for providing an output signal and a mixing and amplification stage coupled between the RF-input and the demodulator output;
wherein the calibration circuitry is configured to apply a calibration input signal at the RF-input and sense a resulting calibration output signal at the demodulator output to derive a gain of the mixing and amplification stage based on a relationship between the calibration output signal and the calibration input signal; and
wherein the calibration circuitry is further configured to switch between different configurations of the mixing and amplification stage based on the derived gain of the mixing and amplification stage,
wherein the calibration circuitry is configured to switch between different configurations of the input circuit based on the derived gain of the mixing and amplification stage.

21. A RF-demodulator comprising:
an RF-input;
a demodulator output;
a mixing and amplification stage coupled between the RF-input and the demodulator output; and
a calibration circuitry configured to apply a calibration input signal at the RF-input and to sense a resulting calibration output signal at the demodulator output to derive a gain of the mixing and amplification stage based on a relationship between the calibration output signal and the calibration input signal;
wherein the mixing and amplification stage comprises a mixer input stage coupled to the RF-input, an active filtering stage coupled to the demodulator output and a mixer core coupled between the mixer input stage and the active filtering stage;
wherein the mixer input stage is configured to amplify the calibration input signal, to provide a first intermediate calibration signal to the mixer core;
wherein the mixer input stage is further configured to amplify an RF signal received at the RF-input and provide a first intermediate RF signal to the mixer core; and
wherein the mixer input stage is configured to use one and the same signal path for amplifying the calibration input signal and the received RF-input signal;
wherein the mixer core is configured to perform a mixing based on an oscillator signal received at an oscillator signal input thereof and the first intermediate RF-signal, and provide a second intermediate RF-signal to the active filtering stage;
wherein the calibration circuitry is configured to apply a bias signal to the oscillator signal input of the mixer core for establishing a signal path for the first intermediate calibration signal through the mixer core, and provide a second intermediate calibration signal to the active filtering stage;
wherein the active filtering stage is configured to provide an RF-output signal at the demodulator output of the demodulator based on the second intermediate RF-signal and provide the calibration output signal at the RF-output based on the second intermediate calibration signal; and
wherein the calibration circuitry is configured to switch between different configurations of the mixing and amplification stage, based on the derived gain of the mixing and amplification stage.

* * * * *